United States Patent [19]

Cherukuri et al.

[11] Patent Number: 5,256,469
[45] Date of Patent: Oct. 26, 1993

[54] MULTI-LAYERED, CO-FIRED, CERAMIC-ON-METAL CIRCUIT BOARD FOR MICROELECTRONIC PACKAGING

[75] Inventors: Stayam C. Cherukuri, North Brunswick; Lubomyr S. Onyshkevych, Lawrenceville; Ashok N. Prabhu, East Windsor; Barry J. Thaler, Lawrenceville, all of N.J.

[73] Assignee: General Electric Company, Schenectady, N.Y.

[21] Appl. No.: 809,371

[22] Filed: Dec. 18, 1991

[51] Int. Cl.$^5$ ............................................ B32B 9/00
[52] U.S. Cl. ................................... 428/210; 428/209; 428/901
[58] Field of Search .................. 428/901, 209, 210

[56] References Cited

U.S. PATENT DOCUMENTS

| | | | |
|---|---|---|---|
| 4,256,796 | 3/1981 | Hang et al. | 428/210 |
| 4,291,107 | 9/1981 | Barry et al. | 429/104 |
| 4,645,552 | 2/1987 | Vitriol et al. | 156/89 |
| 4,952,531 | 8/1990 | Cherukuri | 501/69 |
| 5,041,695 | 8/1991 | Olenick et al. | 174/52.4 |
| 5,043,222 | 8/1991 | Cherukuri | 428/432 |
| 5,044,074 | 9/1991 | Hadwiger et al. | 29/848 |
| 5,047,371 | 9/1991 | Cherukuri | 501/21 |

*Primary Examiner*—Patrick J. Ryan
*Assistant Examiner*—Cathy Lee
*Attorney, Agent, or Firm*—Joseph S. Tripoli; Dennis H. Irlbeck; Vincent J. Coughlin, Jr.

[57] ABSTRACT

The present invention relates broadly to any type of multi-layered, co-fired, ceramic-on-metal circuit board, as a new article of manufacture.

The present invention is more specifically directed to various compositions of MgO-13 $B_2O_3$—$SiO_2$ system glass-ceramics and compositions of such glass-ceramic and suitable fillers, which are suitable for use in the fabrication of multi-layered, co-fired, ceramic-on-metal circuit boards, in which the co-fired, multi-layered ceramic exhibits desirable electrical properties and a temperature coefficient of expansion which closely matches that of its co-fired metal base, although these compositions may have other uses.

16 Claims, 1 Drawing Sheet

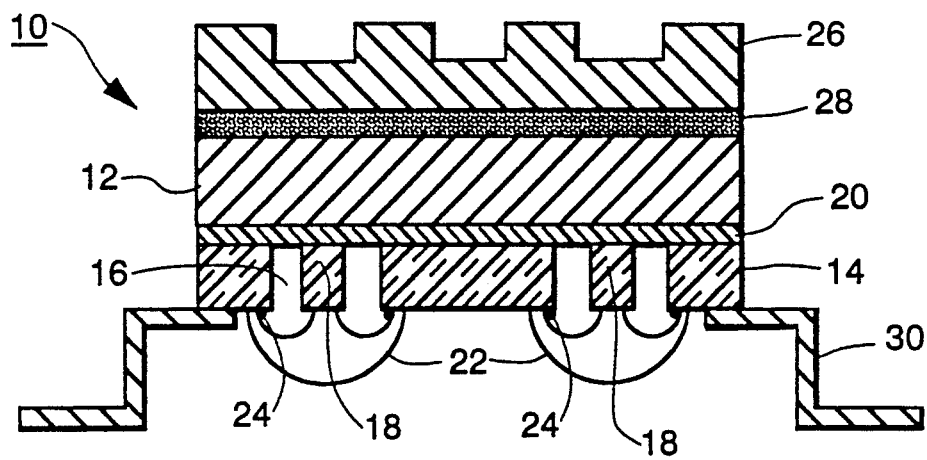

MULTI-LAYERED, CO-FIRED, CERAMIC-ON-METAL CIRCUIT BOARD FOR MICROELECTRONIC PACKAGING

BACKGROUND OF THE INVENTION

As known in the art, multi-layered, co-fired, ceramic circuit boards are fabricated from a stack of layers of ceramic dielectric tape sold under the trademark, GREEN TAPE, manufactured by the E. I. Du Pont Company of Wilmington, Del. Each layer of the ceramic tape has a thickness of about five mils (0.005 inch). The surface of each layer may have metallic conductors printed thereon that can be electrically interconnected by means of small holes (knows as vias) in one or more of the layers. The holes are filled with a conductive material. Such a co-fired, ceramic circuit board is described in U.S. Pat. No. 5,041,695 issued on Aug. 20, 1991 to J. A. Olenick.

Two types of co-fired, ceramic circuit boards are available. These are: (i) high temperature fire (typically below 1300° C.) and (ii) low temperature fire (typically below 1000° C.). The high temperature, co-fire technology is used for alumina and aluminum nitride ceramics, whereas the low temperature, co-fire technology is used for glass ceramics (ceramic filler filled vitreous glasses or devitrifying glasses). The conductor metallurgy for high temperature, co-fired boards is W or Mo-Mn, whereas low temperature, co-fired circuit boards utilize Ag, Au, AgPd or Cu conductors.

Shrinkage in volume experienced by the ceramic bodies after firing is a encountered in the fabrication of multi-layered, co-fired, ceramic circuit boards. This shrinkage, which occurs in the x and y surface dimensions as well as in the z thickness dimension of the respective layers, results from the release, during firing, of the air distributed between the particles as well as the organic binder material in the green tape. Such shrinkage is quite high, typically 10–15% for low temperature, co-fired circuit boards. While one can attempt to compensate for such shrinkage in the x and y surface dimensions by oversizing the area of the green tape layers, it is quite difficult to control shrinkage consistently. For instance, in order that the variation in the x and y dimensions of the multi-layered circuit board, after firing, be maintained within 0.1%, a degree of control that may be as large as one to two parts in one hundred in the amount of shrinkage is required. Because of this, the yield on co-fired circuit boards is low. In addition, the low temperature, co-fired circuit boards suffer from poor thermal conductivity and low flexure strengths associated with the glass ceramic.

A single layer of ceramic fired on a metal base, such as porcelain enamel-on-steel, is known in the art. Because the temperature coefficient of expansion exhibited by the steel, which comprises such a base, is relatively large, the composition of the ceramic layer fired on the steel base also must exhibit a relatively large temperature coefficient of expansion, in order to closely match that of the base. High barium, high-expansion glass-ceramics have been developed which may be used to fabricate such porcelain enamel-on-steel boards. While other ceramic composition systems are known that exhibit a relatively large temperature coefficient of expansion, high-expansion in these systems is typically achieved by the addition of heavy metal oxides, e.g., lead, barium, or alkali, e.g., sodium and potassium. However, this results in higher dielectric constants, and higher dielectric losses, and may lead to poor chemical durability, which makes such high-expansion systems poor candidates for use in fabricating multi-layered, co-fired, ceramic circuit boards that may be employed in microelectronic packaging.

SUMMARY OF THE INVENTION

The present invention is directed broadly to a multi-layered, co-fired ceramic on a metal base and, more particularly, to a system of low temperature, co-fired, high-expansion glass ceramics that, when fine-tuned with certain fillers, exhibit dielectric constants and dielectric losses that are sufficiently low to make them suitable for use in the fabrication of multi-layered, co-fired ceramic-on-metal circuit boards suitable for microelectronic packaging.

BRIEF DESCRIPTION OF THE DRAWING

The sole FIGURE diagrammatically illustrates an example of a microelectronic package fabricated in accordance with the principles of the present invention.

DESCRIPTION OF THE PREFERRED EMBODIMENTS

The fabrication technique involves laminating multiple layers of low-temperature-fire green ceramic tape on a metal base and then co-firing the structure. Preferably, the surface of the metal base to be situated in contact with the bottom layer of green ceramic tape should be preliminarily prepared with a very thin (e.g., 1 mil) glass bonding layer that has been previously melted thereon. This glass bonding layer, which remelts during the co-firing, acts as an adhesive for insuring that the multi-layered ceramic, after co-firing, is securely attached to its metal base. This glass bonding layer is described in U.S. patent application Ser. No. 07/809,372 filed on Dec. 18, 1991, and entitled, "Method of Minimizing Lateral Shrinkage In A Co-Fired, Ceramic-On-Metal Circuit Board", by A. N. Prabhu, and assigned to the assignee of the present invention.

More specifically, lamination can be done before or after removing organics from the tape. The metal base may comprise either a single material or a composite material. Examples of suitable metal base materials include Cu, Al, stainless steel, Ni, low carbon steel, Cu/Invar/Cu, Cu/Mo/Cu, or Cu/stainless steel/Cu. The thermal expansion characteristics of the ceramic are adjusted to be compatible with the selected metal base. The peak firing temperatures selected for co-firing depend upon the metal and the ceramic. The adhesion of the ceramic to the metal base significantly minimizes x-y shrinkage of the ceramic during co-firing (i.e., shrinkage in volume is mostly confined to the z thickness dimension). Thus, x-y shrinkage may be reduced to about 1%, or less. In addition, the metal base exhibits good thermal conductivity and high flexure strength, thereby overcoming the problems of poor thermal conductivity and low flexure strength suffered by prior-art circuit boards comprising only multi-layers of low temperature, co-fired, glass ceramic.

The conductor metallurgy can be Ag, Au, AuPt, AgPd, Ni, or Cu. The base metal circuit boards are typically fired in nitrogen. Nitrogen or any other inert atmosphere may also be required to fire precious metal conductor co-fire circuit boards to prevent oxidation of the metal base. Appropriate slots can be provided in the laminated tape for integrated-circuit chips to be placed directly on the metal base using adhesive, solder attachment, or other direct bonding method to provide very efficient heat spreading. High density circuitry can be produced on the co-fired ceramic using photolighography for top layer conductors. It is also possible to spin-on additional polymer layers on the co-fired ceramic and then use thin film-plating techniques to form very high density circuitry.

The co-fired circuit board on metal base technology disclosed herein, in addition to producing high density circuit boards with excellent thermal dissipation and shrinkage control characteristics, helps to obtain a mechanically rugged base. Also, the integrated circuit chips and other components can be attached either directly on metal by either providing slots in the green tape, as shown in the sole FIGURE discussed below, or on the opposite surface of the metal base from the multi-layered ceramic. Components can be attached by soldering, wire bonding, TAB, flip-chip or adhesive attach. The packages can be hermetic (glass-sealing on metal) or non-hermetic with appropriate encapsulation for component protection.

While it is not intended to limit the multi-layered, co-fired ceramic-on-metal technology of the present invention to any particular application, its suitability for microelectronic packaging depends on the fired multi-layered ceramic exhibiting appropriate electrical properties, in addition to having other appropriate properties for this purpose. In this regard, reference is made to the following Table I, which is an example of electrical and other property value constraints required of the fired multi-layered ceramic in one practical case of microelectronic packaging.

TABLE I

| Property | Desired Value |
| --- | --- |
| Coef. of Thermal Expansion (25-250° C.) | 90-130 × $10^{-7}$/°C. |
| Dielectric Constant (1 MHz) | <6.6 |
| Dissipation Factor (1 MHz) | <0.0035 |
| Breakdown Voltage | >2 kV/mm |
| Specific (Volume) Resistivity | >$10^{12}$ Ωcm |
| Resistivity of buried conductor | <10 mΩ/square |
| Resistivity of via conductor | <50 mΩ/square |
| Resistivity of surface conductor | <50 mΩ/square |
| Camber | <0.005"/inch |
| Long term reliability (HHBT conditions) | no shorts |

In Table I, HHBT conditions, which respect to long term reliability, refers to an accelerated aging test, in which a microelectronic packaging sample, under high humidity and high temperature conditions, withstands a given voltage stress for a given time without electrical breakdown.

The application of the multi-layered, co-fired, ceramic-on-metal technology of the present invention to microelectronic packaging required the development of glass-ceramic (GC) compositions capable of being used in glass-ceramic+filler (GC/F) compositions that meet the constraints set forth above in Table I.

In the past, glass, glass-ceramic, and glass+filler systems have been developed and successfully employed in microelectronics packaging for high density packaging applications. The major advantage of these materials over the conventional ceramics such as alumina is the lower firing temperature, which enables the use of higher electrically conductive Ag, Cu, Au, and AG-Pd as compatible metallizations. There was a proliferation of glass-ceramic and glass+filler systems during these developments; however, emphasis was laid on matching thermal expansion to silicon and in some cases to Ga-As. Thermal expansion coefficients typically ranged from 30–70=$10^{-7}$/° C. The issues related to controlling dielectric constant, dielectric loss, strength, bulk and surface resistivities, electrical breakdown strength, chemical durability, shrinkage during firing, and compatibility with metalliation were addressed in a broad range of borate, boro-silicate, and silicate glass and glass-ceramic systems containing low or intermediate expansion fillers such as alumina, cordierite, forsterite, eucryptite, etc. However, none of these glass, glass-ceramic, and glass+filler systems substantially exhibits the property-value constraints set forth in Table I. In particular the expansion coefficient of these prior-art composition systems is too low to be successfully employed in the fabrication of multi-layered, co-fired, ceramic-on-metal, high density circuit boards.

It is one of the objects of the present invention to (1) identify a glass-ceramic system, and specific glass-ceramic compositions within this system, with suitable thermal, electrical, chemical, and mechanical properties that make them likely candidates for use in fabricating a multi-layered, co-fired, ceramic-on-metal, high density circuit board, and (2) then incorporate appropriate fillers in such likely GC candidates to fine-tune the composite GC/F to substantially meet the property value constraints set forth in Table I.

In this regard, Table II, set forth below, is directed to an MgO-13 $B_2O_3$—$SiO_2$ system containing CaO, ZnO, and $SnO_2$ as additives that was chosen for the development of likely glass-ceramic (GC) candidates for use in fabricating a multi-layered, co-fired, ceramic-on-metal, high density circuit board. No alkaline oxides are deliberately added to the glasses, but may be present as impurities in the raw materials. $ZrO_2$ was incorporated in all compositions as a nucleating agent for controlled crystallization. The compositions of the different glasses that were prepared and evaluated are shown in Table II. Glass-ceramics were produced by heat-treating the glasses at 850–950° C. for 10—30 minutes. The thermal expansion coefficient of the resultant glass-ceramics ranged from 85 to 105×$10^{-7}$/° C. over a temperature range from room temperature (RmT) to about 600° C. (as specifically exemplified below in Table II by the thermal expansion coefficient of each of glass-ceramics GC-1 to GC-7), which is appropriate for further tailoring by incorporation of fillers. Sensitivity to moisture was evaluated by exposing the glass-ceramics to steam at 15 psi for twelve hours. All the compositions showed no clear evidence of deterioration in moisture.

TABLE II

Candidate Glass-Ceramic Compositions in the MgO—$B_2O_3$—$SiO_2$ System (Weight %)

| Id. | $SiO_2$ | $B_2O_3$ | MgO | ZnO | CaO | $SnO_2$ | BaO | $ZrO_2$ | $Cr_2O_3$ | α × $10^{-7}$/°C. (RmT-600° C.) |
| --- | --- | --- | --- | --- | --- | --- | --- | --- | --- | --- |
| GC-1 | 17 | 28 | 45 | 8.5 | — | — | | 1.5 | | 92 |
| GC-2 | 17.8 | 31.0 | 48.6 | — | — | — | | 2.6 | | 97 |
| GC-3 | 16.4 | 28.5 | 43.2 | 9.5 | — | — | | 2.4 | | 105 |
| GC-4 | 17.5 | 29.5 | 43 | — | 4 | — | | 2.0 | | 86 |

TABLE II-continued

Candidate Glass-Ceramic Compositions in the MgO—B$_2$O$_3$—SiO$_2$ System
(Weight %)

| Id. | SiO$_2$ | B$_2$O$_3$ | MgO | ZnO | CaO | SnO$_2$ | BaO | ZrO$_2$ | Cr$_2$O$_3$ | $a \times 10^{-7}$/°C. (RmT-600° C.) |
|---|---|---|---|---|---|---|---|---|---|---|
| GC-5 | 14.5 | 25.2 | 34.7 | 5.6 | 4.8 | 13.0 | | 2.1 | | 84 |
| GC-6 | 14.3 | 24.8 | 34.2 | — | 6.7 | 17.9 | | 2.1 | | 86 |
| GC-7 | 16.9 | 30.0 | 39.1 | 9.1 | 3.7 | — | | 1.2 | | 85 |
| GC-8 | 15.9 | 28.3 | 41.2 | 9.23 | 4.2 | — | | 1.2 | | — |
| GC-9 | 17.5 | 31.8 | 43.0 | — | 6.53 | — | | 1.2 | | — |
| GC-10 | 16.7 | 30.4 | 29.9 | — | 21.9 | — | | 1.1 | | — |
| GC-11 | 16.1 | 28.5 | 25.1 | 8.7 | 20.5 | — | | 1.1 | | — |
| GC-12 | 16.8 | 29.8 | 38.8 | 9.1 | 3.6 | — | | 0.9 | 1.0 | — |
| GC-13 | 15.8 | 28.0 | 34.4 | 8.5 | 3.4 | | 8.0 | 0.4 | 1.5 | — |
| GC-14 | 16.6 | 30.0 | 31.8 | 8.4 | 3.4 | | 7.9 | 0.4 | 1.5 | — |

Based on the compositions of the aforesaid glass ceramics GC-1 through GC-14, the following composition ranges (by weight percent) are identified to be suitable for expansion matched glass-ceramics co-fired on copper/stainless steel/copper metal cores:

| | |
|---|---|
| SiO$_2$ | 10-20% |
| B$_2$O$_3$ | 20-35% |
| MgO | 25-50% |
| ZnO | 0-10% |
| CaO | 0-22% |
| SnO$_2$ | 0-18% |
| BaO | 0-10% |

It may be possible to incorporate other oxides, including alkali and heavy metal oxides, in small quantities with minor effect on dielectric constant and dielectric loss. Other nucleating agents such as TiO$_2$ and P$_2$O$_5$ also may be used instead of ArO$_2$. For example, up to 5% by weight (individual or combined) of these nucleating agents can be included. For obtaining suitable color, up to 3% by weight (individual or combined) of Cr$_2$O$_3$, CoO, Fe$_2$O$_3$, CuO, CeO$_2$, and/or Pr$_2$O$_3$ may be incorporated. Further, the glass-ceramic may include, as other additives, up to 10% by weight, (individual or combined) Li$_2$O, Na$_2$O, K$_2$O, Al$_2$O$_3$, PbO, Bi$_2$O$_3$, and/or SrO.

Three fillers were chosen as candidates for tailoring the glass-ceramic properties. They are Fluorspar (CaF$_2$), Quartz (SiO$_2$), and Cristobalite (SiO$_2$). The thermal expansion coefficients of Fluorspar, Quartz, and Cristobalite in the range of 20° C. to 600° C. are 225, 237, and $271 \times 10^{-7}$/°C. respectively. Several glass-ceramic/filler (GC/F) combinations were processed by standard tape casting procedures. One or more of these fillers, up to 50% by volume, were considered for altering the expansion and dielectric constant of the base glass-ceramics (GC). By varying the amount of filler in the glass-ceramic/filler system, the expansion coefficient of the glass-ceramic/filler (GC/F) systems can be increased up to $130 \times 10^{-7}$/°C.

Five novel glass-ceramic/filler materials (GC/F-1 to GC/F-5) having properties suitable for use in fabricating multi-layered, co-fired, ceramic circuit boards are shown below in Table III. Of these five glass-ceramic/filler materials, GC/F-4 and GC/F-5 were found to have the best overall properties for this purpose.

TABLE III

| | GC/F-1 | GC/F-2 | GC/F-3 |
|---|---|---|---|
| Composition (Weight %) | 70 GC-7 + 15 Fluorspar + 15 Quartz | 75 GC-8 + 25 Fluorspar | 70 GC-9 + 15 Quartz + 15 Fluorspar |
| Expansion Coefficient ($10^{-7}$/°C.) (Rm.T.-600° C.) | 116 | 106 | 110 |
| Dielectric Constant (@ 10 KHz) | 6.4 | 5.6 | 6.5 |
| Dissipation Factor (@ 10 KHz) | 0.2% | 0.2% | 0.2% |

| | GC/F-4 | GC/F-5 |
|---|---|---|
| Composition (Weight %) | 70 GC-12 + 15 Fluorspar + 15 Quartz | 70 GC-13 + 15 Fluorspar + 15 Quartz |
| Expansion Coefficient ($10^{-7}$/°C.) (Rm.T.-60° C.) | 115-120 | 120-125 |
| Dielectric Constant (@ 1 MHz) | 6.2-6.6 | 6.3-6.9 |
| Dissipation Factor | | |
| (@ 10 KHz) | 0.1% | 0.3% |
| (@ 1 MHz) | 0.3% | 0.5% |
| Peak Firing Temp. (°C.) | 930-935 | 910-920 |
| Moisture Resistance HHBT (60° C., 90RH, 48V) | Good | Good |
| | Pass | Pass |
| Volume Resistivity | >10$^{12}$ Ωcm | >10$^{12}$ Ωcm |

A combined weight of up to 50% of the fillers Quartz, Fluorspar and/or Cristobalite can be incorporated for further elevation of the thermal expansion coefficient and improvement of the shrinkage behavior.

Reference is now made to the example of microelectronic packaging of a multichip module shown in the sole FIGURE. As shown, the co-fired, ceramic-on-metal structure 10 comprises the metal base 12 with co-fired multi-layer ceramic 14 bonded thereto. Each layer of the laminated green tape, prior to firing, may be provided with suitable holes, which, after firing, provide slots 16 in co-fired multi-layered ceramic 14, thereby permitting integrated-circuit chips 18 (or other components) to be attached directly to metal base 12. A glass bonding layer 20 is disposed between the base 12 and the ceramic 14. Each of the chips 28 may be then heremetically sealed to metal base 12 by a suitable glass-on-metal sealant 24, as known in the art. Alternatively, each of chips 18 may be protected by a non-hermetic sealed encapsulant 22. The encapsulant is attached to the ceramic 14. Heat sink 26 is attached to the other (i.e., top) side of metal base 12 by adhesive 28. Further, the microelectronic packaging includes support structure 30 attached to the edge of ceramic 14 for mounting the multichip module shown in the sole FIGURE.

Although not shown in the sole FIGURE, co-fired, multi-layer ceramic 14 incorporates metallic conductors which currently comprise Ag and Ag/Pd. However, metallic conductors comprising Cu or Au also should be compatible with co-fired, multi-layer, ceramic-on-metal boards of the type disclosed herein.

While the new glass-ceramic (GC) materials shown in Table II and, particularly, the glass-ceramic/filler materials shown in Table III were developed for use in the microelectronic packaging of a ceramic-on-metal multichip module of the type shown in the sole FIGURE, these new materials also should be useful for other standard multi-layer ceramic packages, with or without the incorporation of a metal-base.

What is claimed is:

1. A co-fired, multi-layered, ceramic-on-metal circuit board comprising a structure having a metal base, a bonding layer of glass on said base, and a ceramic formed from multiple layers of a ceramic tape on said bonding layer, each layer of said multiple layers of ceramic tape comprising a glass-ceramic/filler composition wherein the composition of the glass ceramic is within a range 10-20 wt % $SiO_2$, 20-35 wt % $B_2O_3$, and 25-50 wt % MgO.

2. The circuit board defined in claim 1, wherein:
each of said metal and said glass-ceramic/filler composition exhibits a temperature coefficient of expansion that closely matches one another, within $5-10 \times 10^{-7}/°C$., over a temperature range from room temperature to about 600° C.

3. The circuit board defined in claim 2, wherein said glass-ceramic/filler composition exhibits:
a temperature coefficient of expansion between $90-130 \times 10^{-7}/°C$.;
a dielectric constant within the range of 4 to 6.9 at 1 MHz; and
a dissipation factor within the range of 0.1% to 0.5% at 1 MHz.

4. The circuit board defined in claim 3, wherein:
said glass-ceramic/filler composition, by weight, consists of at least 50% glass-ceramic composition and a filler composition of no greater than a 50%, and said filler composition comprises at least one of Quartz, Fluorspar or Cristobalite.

5. The circuit board defined in claim 4, wherein:
said glass-ceramic/filler composition, by weight, consists of substantially 70% of a given glass-ceramic composition and substantially 30% of a given filler composition;
said given glass-ceramic composition, by weight, consists of substantially 16.9% $SiO_2$, 30.0% $B_2O_3$, 39.2% MgO, 9.1% ZnO, 3.7% CaO, and 1.2% $ZrO_2$; and
said given filler composition, by weight, consists of substantially 50% Fluorspar and 50% Quartz.

6. The circuit board defined in claim 4, wherein:
said glass-ceramic/filler composition, by weight, consists of substantially 75% of a given glass-ceramic composition and substantially 25% of a given filler composition;
said given glass-ceramic composition, by weight, consists of substantially 15.9% $SiO_2$, 28.3% $B_2O_3$, 41.2% MgO, 9.23% ZnO, 4.2% CaO, and 1.2% $ZrO_2$; and
said given filler composition, by weight, consists of substantially 100% Fluorspar.

7. The circuit board defined in claim 4, wherein:
said glass-ceramic/filler composition, by weight, consists of substantially 70% of a given glass-ceramic composition and substantially 30% of a given filler composition;
said given glass-ceramic composition, by weight, consists of substantially 17.5% $SiO_2$, 31.8% $B_2O_3$, 43.0% MgO, 6.53% CaO, and 1.2% $ZrO_2$; and
said given filler composition, by weight, consists of substantially 50% Fluorspar and 50% Quartz.

8. The circuit board defined in claim 4, wherein:
said glass-ceramic/filler composition, by weight, consists of substantially 70% of a given glass-ceramic composition and substantially 30% of a given filler composition;
said given glass-ceramic composition, by weight, consists of substantially 16.8% $SiO_2$, 29.8% $B_2O_3$, 38.8% MgO, 9.1% ZnO, 3.6% CaO, 0.9% $ZrO_2$, and 1.0% $Cr_2O_3$; and
said given filler composition, by weight, consists of substantially 50% Fluorspar and 50% Quartz.

9. The circuit board defined in claim 4, wherein:
said glass-ceramic/filler composition, by weight, consists of substantially 70% of a given glass-ceramic composition and substantially 30% of a given filler composition;
said glass-ceramic composition, by weight, consists of substantially 15.8% $Si_2$, 28.0% $B_2O_3$, 34.4% MgO, 8.5% ZnO, 3.4% CaO, 8.0% BaO, 0.4% $ZrO_2$, and 1.5% $Cr_2O_3$; and
said given filler composition, by weight, consists of substantially 50% Fluorspar and 50% Quartz.

10. The circuit board defined in claim 1, wherein:
said metal base consists of one of Cu, Al, stainless steel, Ni, low carbon steel, Cu/Invar/Cu, Cu/Mo/Cu, and Cu/stainless steel/Cu.

11. The circuit board defined in claim 1, wherein:
at least one of the layers of said co-fired, multi-layered ceramic includes printed conductors thereon comprising at least one of Ag, Au, AuPt, Ag/Pd, Ni, and Cu.

12. The circuit board defined in claim 1, wherein:
said multi-layered ceramic incorporates at least one slot extending therethrough to the metal underlying said slot.

13. The circuit board defined in claim 12, further comprising:
a microelectronic component extending into said slot and attached directly to said underlying metal.

14. The circuit board defined in claim 13, wherein:
said microelectronic component comprises an integrated-circuit chip.

15. The circuit board defined in claim 13, further comprising:
an encapsulant covering said microelectronic component and said slot, said encapsulant being attached to said multilayered ceramic.

16. The circuit board defined in claim 15, wherein:
said microelectronic component is hermetically sealed by said covering encapsulant.

* * * * *

UNITED STATES PATENT AND TRADEMARK OFFICE
CERTIFICATE OF CORRECTION

PATENT NO. : 5,256,469
DATED : Oct. 26, 1993
INVENTOR(S) : Satyam C. Cherukuri et al.

It is certified that error appears in the above-identified patent and that said Letters Patent is hereby corrected as shown below:

Title page, [75[ "Stayam" should be --Satyam--.

Col. 1, line 32, before "encountered", add --problem--.

Col. 4, line 11, after "30-70" change "=" to --x--.

Col. 4, line 15, change "metalliation" to --metallization--.

Col. 4, line 37, after "MgO" delete "13".

Col. 5, line 35, change "$ArO_2$" to --$ZrO_2$--.

UNITED STATES PATENT AND TRADEMARK OFFICE
CERTIFICATE OF CORRECTION

PATENT NO. : 5,256,469

DATED : Oct. 26, 1993

INVENTOR(S) : Satyam C. Cherukuri et al.

It is certified that error appears in the above-identified patent and that said Letters Patent is hereby corrected as shown below:

Col. 6, line 33, TABLE III
change "60°C" to --600°C--.

Col. 8, line 23, change
"Cr203" to --$Cr_2O_3$--.

Col. 8, line 33, change
"$Si_2$" to --$SiO_2$--.

Col. 8, line 35, change
"Cr203" to --$Cr_2O_3$--.

Signed and Sealed this

Third Day of May, 1994

Attest:

BRUCE LEHMAN

*Attesting Officer*     *Commissioner of Patents and Trademarks*